United States Patent
Choi (10) Patent No.: US 11,664,220 B2
(45) Date of Patent: May 30, 2023

(54) EDGE EXCLUSION APPARATUS AND METHODS OF USING THE SAME

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/595,618

(22) Filed: Oct. 8, 2019

(65) Prior Publication Data

US 2021/0104400 A1   Apr. 8, 2021

(51) Int. Cl.
| | |
|---|---|
| H01L 21/02 | (2006.01) |
| B05D 3/06 | (2006.01) |
| B41D 7/00 | (2006.01) |
| B81C 99/00 | (2010.01) |
| B29C 33/42 | (2006.01) |
| B29C 33/40 | (2006.01) |
| B29C 33/38 | (2006.01) |

(52) U.S. Cl.
CPC ........ *H01L 21/02282* (2013.01); *B05D 3/067* (2013.01); *B29C 33/3857* (2013.01); *B29C 33/40* (2013.01); *B29C 33/424* (2013.01); *B41D 7/00* (2013.01); *B81C 99/009* (2013.01); *H01L 21/02348* (2013.01); *H01L 21/02354* (2013.01)

(58) Field of Classification Search
CPC . G03F 7/0002; G03F 7/26; G03F 7/70; G03F 7/70691; G03F 7/7055; B05D 3/067; B29C 33/424; B41D 7/00
See application file for complete search history.

(56) References Cited

U.S. PATENT DOCUMENTS

| | | | |
|---|---|---|---|
| 8,946,093 B2 | 2/2015 | Mikami | |
| 2006/0073284 A1* | 4/2006 | Usami | B05D 1/005 |
| | | | 427/508 |
| 2014/0027955 A1* | 1/2014 | Wakabayashi | G03F 7/00 |
| | | | 264/447 |
| 2015/0118847 A1* | 4/2015 | Mikami | B29C 59/026 |
| | | | 438/694 |
| 2019/0179228 A1* | 6/2019 | Khusnatdinov | G03F 7/70116 |

* cited by examiner

*Primary Examiner* — Michael P Wieczorek
(74) *Attorney, Agent, or Firm* — Abel Schillinger, LLP (57) ABSTRACT

A method of deposition is disclosed. The method can include dispensing a formable material over a substrate, where the substrate includes a non-uniform surface topography, and where the substrate includes an active zone and an exclusion zone. The method can also include curing the formable material in the exclusion zone to form a circular edge between the exclusion zone and the active zone, contacting the formable material with a superstrate, and curing the formable material in the active zone to form a layer over the substrate, wherein curing is performed while the superstrate is contacting the formable material.

15 Claims, 6 Drawing Sheets

EDGE EXCLUSION APPARATUS AND METHODS OF USING THE SAME

FIELD OF THE DISCLOSURE

The present disclosure relates to substrate processing, and more particularly to whole wafer fluid deposition in semiconductor fabrication.

RELATED ART

Fluid deposition techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer. Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nano-imprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed.

However, defects can arise as dispense material spreads on the substrate. Improvements in fluid deposition techniques are desired to allow for whole wafer processing.

SUMMARY

In an aspect a method of deposition is disclosed. The method can include dispensing a formable material over a substrate, where the substrate comprises a non-uniform surface topography, an active zone, and an exclusion zone. The method can further include contacting the formable material with a superstrate, curing the formable material at the edge of the exclusion zone as the material is spreading to form a boundary of an active zone and curing the formable material in the active zone to form a layer over the substrate, where curing is performed while the superstrate is contacting the formable material.

In another aspect, the method can further include positioning one or more light sources over the exclusion zone.

In yet another aspect, the superstrate can be a circular flat glass with a step boundary where the step height of 1-100 um is to set the boundary of the active zone.

In yet another aspect, the superstrate can be a circular flat glass with no step boundary In yet another aspect, the method can further include rotating the one or more light sources over the exclusion zone while curing the formable material in the exclusion zone.

In another aspect, the one or more light sources are rotated about a central axis of the substrate at a rate of between 3 revolutions/second and 100 revolutions/second.

In a further aspect, the method can further include rotating the substrate while curing the formable material at the edge of the exclusion zone.

In another aspect, the method can further include determining an edge of the exclusion zone prior to dispensing formable material over the substrate.

In another aspect, the exclusion zone is between 0.5% and 20% the surface area of the substrate.

In yet another aspect, the exclusion zone surrounds and is exterior to the active zone.

In another aspect, the one or more light sources are UV radiation.

In a further aspect, curing the formable material in the active zone is done by using a light source different from the one or more light sources shining above the exclusion zone.

In yet another aspect, with the curing light active, the formable material at the edge of the exclusion zone has a viscosity at least two orders of magnitude greater than a viscosity of the uncured formable material in the active zone after rotating the one or more light sources over the exclusion zone.

In another aspect, positioning the one or more light sources above the exclusion zone is for between 0.1 second and 20 seconds.

In another aspect, the one or more light sources comprises a laser diode.

In another aspect, the one or more light sources comprises a UV light emitting diode (UV LED).

In another aspect, the one or more light sources comprises a UV light emitting diode (UV LED) with digital micromirror device (DMD).

In another aspect, an apparatus is disclosed. The apparatus can include a stage configured to hold a substrate, where the substrate comprises an exclusion zone and an active zone, a superstrate holder configured to hold a superstrate, a fluid dispenser configured to dispense a curable material on one or both of the substrate and the superstrate, and one or more light sources configured to rotate around the substrate to direct light at the exclusion zone to form a circular edge between the exclusion zone and the active zone.

In yet another aspect, the one or more light sources are configured to rotate around a central axis of the substrate.

In a further aspect, the apparatus can further include a curing light source configured to emit light to the active zone of the substrate.

In another aspect, the one or more light sources are laser diodes.

In another aspect, the one or more light sources are laser diodes with digital micromirror device (DMD).

In another aspect, the one or more light sources comprises a UV light emitting diode (UV LED).

In another aspect, the one or more light sources comprises a UV light emitting diode (UV LED) with digital micromirror device (DMD).

In yet another aspect a method of manufacturing an article is disclosed. The method of manufacturing an article can include dispensing a formable material over a substrate, where the substrate comprises a non-uniform surface topography, an active zone, and an exclusion zone, contacting the formable material with a superstrate, curing the formable material at the edge of the exclusion zone as the material is spreading across the boundary to form a boundary of the active zone, curing the formable material in the active zone to form a layer over the substrate, where curing is performed while the superstrate is contacting the formable material, separating the superstrate and the planar layer on the substrate, processing the substrate on which the planar layer has been formed, and manufacturing the article from the processed substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1:
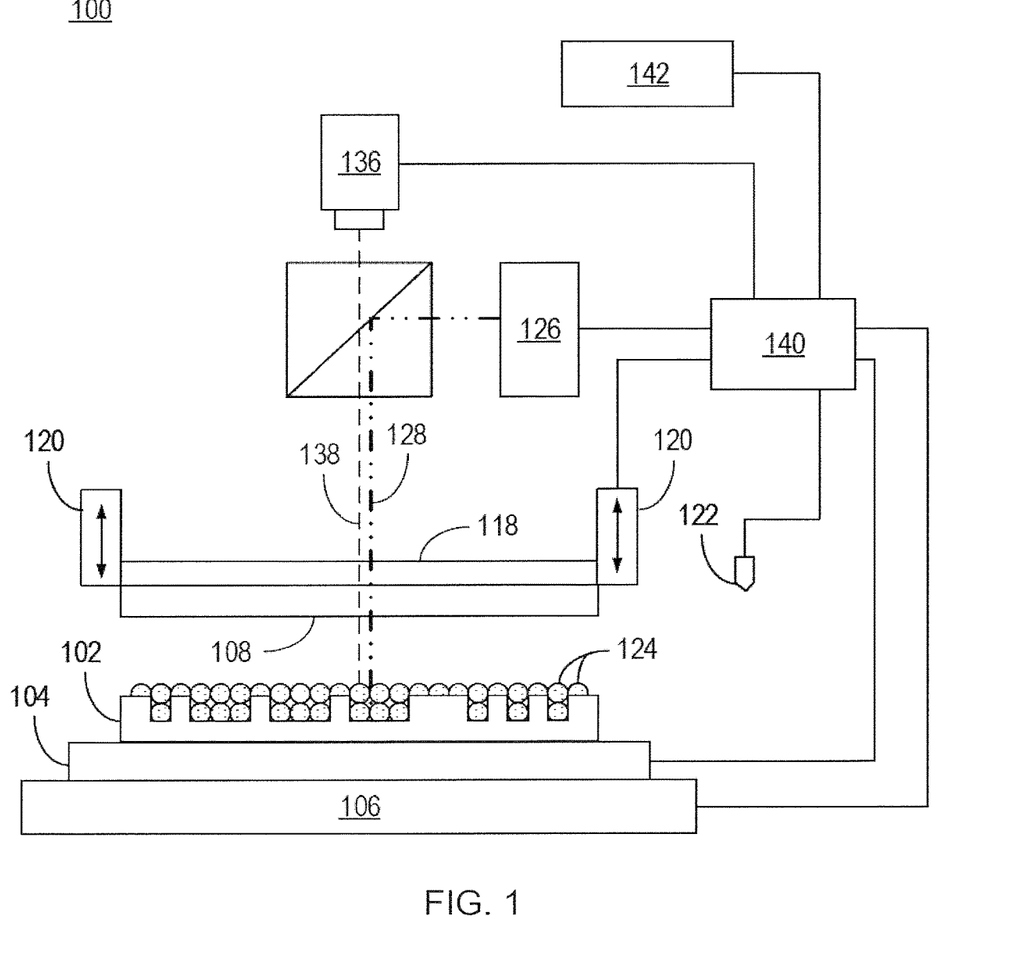
FIG. 1 includes an illustration of a side view of an exemplary system.

Referring to FIG. 1, an apparatus 10 in accordance with an embodiment described herein can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light. Surface 112 is generally of the same areal size or slightly smaller as the surface of the substrate 102. Surface 112 of superstrate 108 can include a planar contact surface. In another embodiment, the contact surface of superstrate 108 can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The apparatus 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the planarization head 120, the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate 108 contacts and spreads droplets of the formable material 124 as further detailed herein.

Figure 2A:
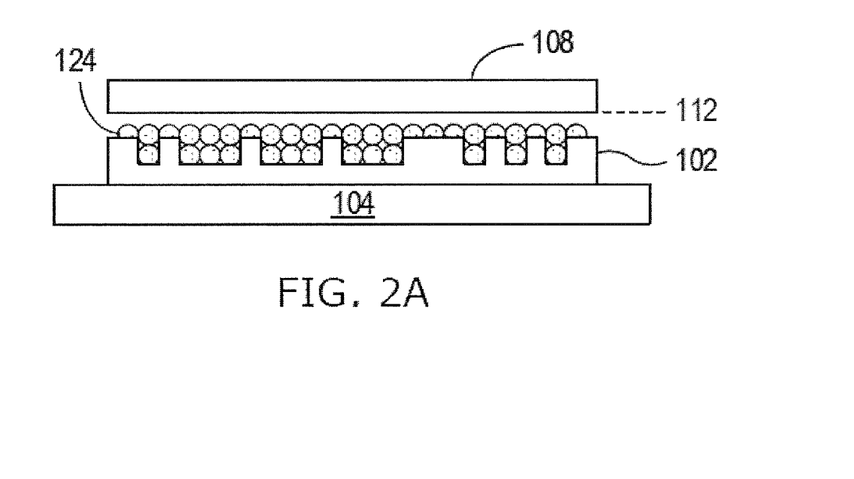
FIGS. 2A to 2C include an illustration of a planarization process.
Figure 2B:
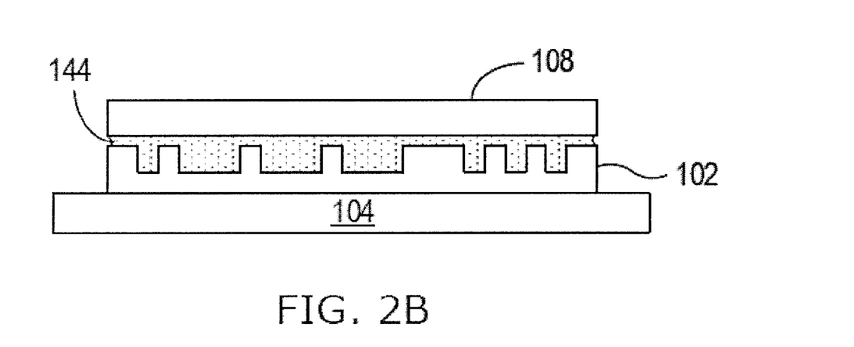
Figure 2C:
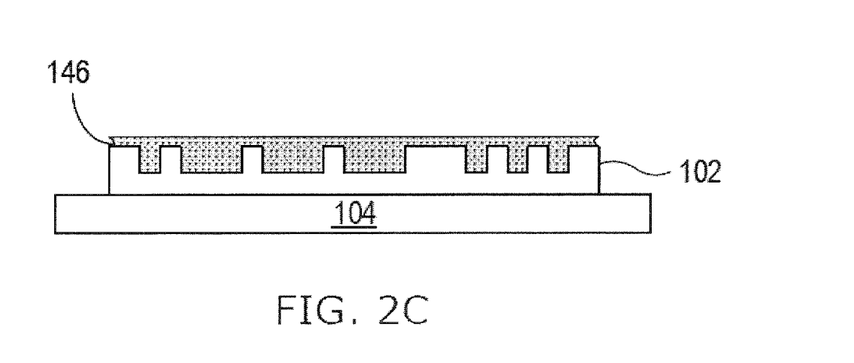

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

Figure 3:
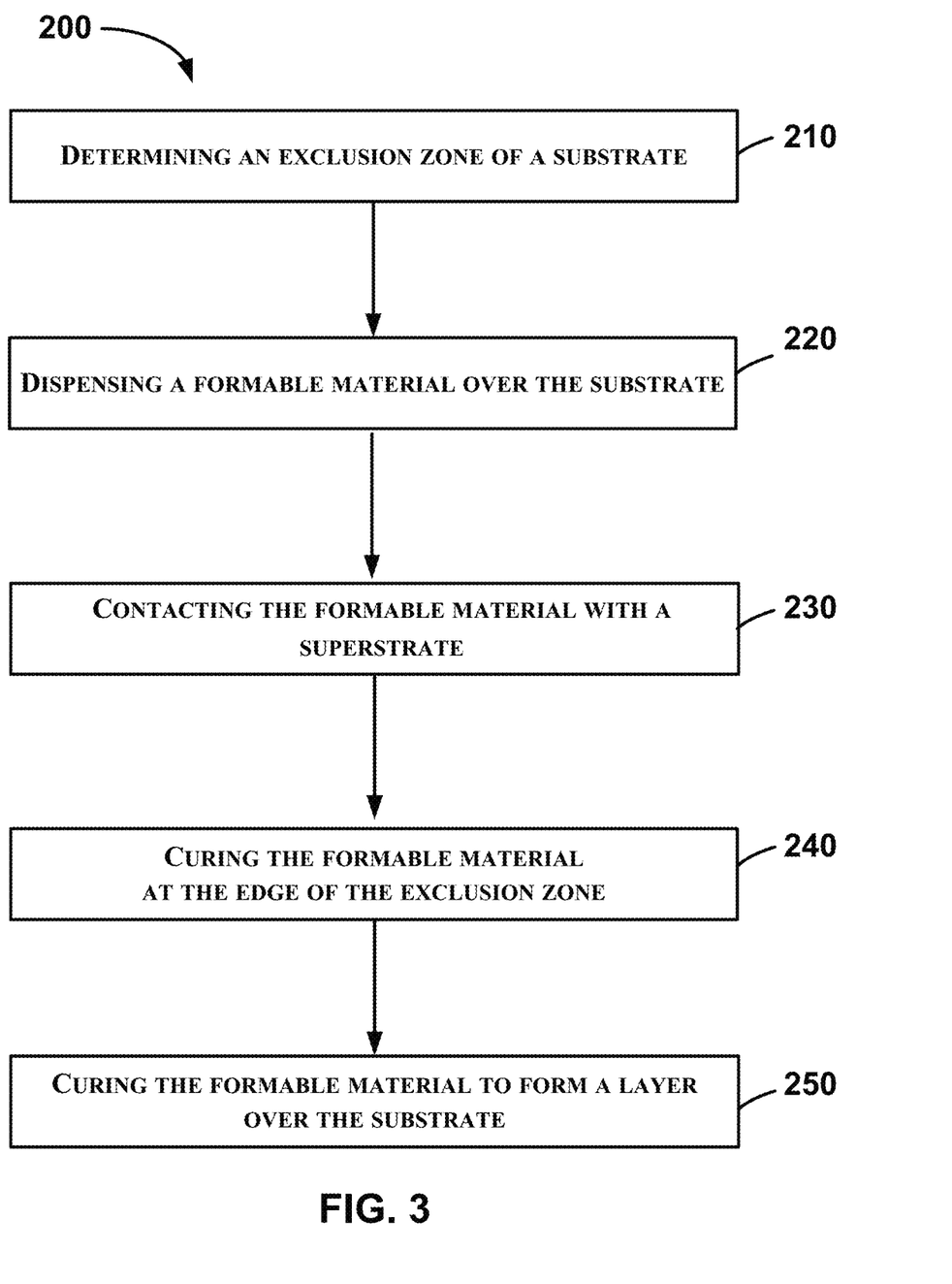
FIG. 3 includes an illustration of a method 200 of the present disclosure, according to one embodiment.
Figure 4:
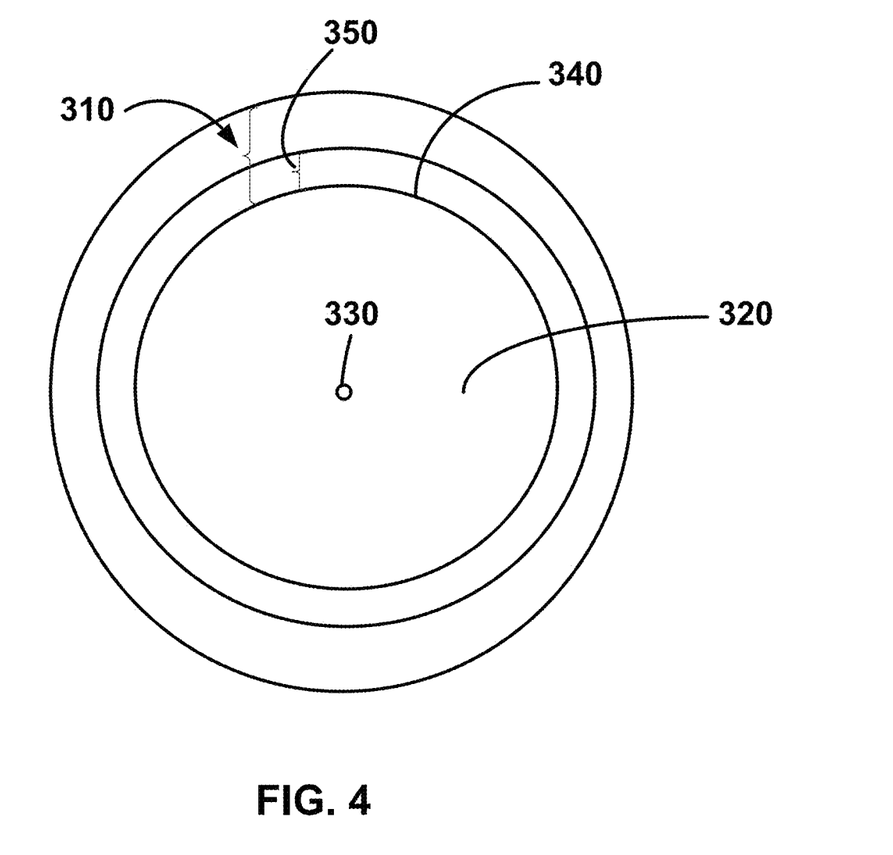
FIG. 4 includes an embodiment of a substrate according to one implementation of the method of FIG. 3.

FIG. 3 includes an illustration of a method 200 of the present disclosure, according to one embodiment. FIG. 4 includes an embodiment of a substrate according to one implementation of the method of FIG. 3. The method begins at operation 210 by determining an exclusion zone 310 of a substrate 12. In one embodiment, an active zone 320 is determined. In one embodiment, the exclusion zone 310 is measured to be a percentage of the substrate 12. In one embodiment, the exclusion zone 310 can be between 0.5% and 20% of the surface area of the substrate 12. In one embodiment, the exclusion zone 310 can circumferentially surround the active zone 320 of the substrate 12. In one embodiment, the exclusion zone 310 can include an edge of the substrate 12. In one embodiment, the exclusion zone 310 can be exterior to the active zone 320.

At operation 220, a formable material 34 can be dispensed over a substrate 12. The substrate 12 can include a non-uniform surface topography. In other words, a surface of the substrate 12 may be non-uniform. In other words, both of the exclusion zone 310 and the active zone 320 of the substrate 12 can include a non-uniform surface topography. The formable material 34 can include a polymerizable material, such as a resist. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the superstrate 18 and the substrate 12.

At operation 230, the superstrate 18 can contact the formable material 34. As the superstrate 18 contacts the formable material 34, any trapped gas particles can dissipate through the curing layer, the substrate or the superstrate 18. In one embodiment, the superstrate 18 can have a body and an amorphous fluoropolymer layer, as described above.

At operation 240, the formable material 34 spreading at the edge of the exclusion zone 310 can be cured earlier than the material in remaining active area. In one embodiment, one or more light sources are positioned over the exclusion zone 310 after the formable material 34 is dispensed on the substrate 12. In one embodiment, the one or more light sources can be positioned directly over the exclusion zone 310. In one embodiment, the one or more light sources can shine straight rays down on the exclusion zone 310 for a period between 0.1 second and 20 seconds. In one embodiment, the one or more light sources can shine straight rays down on the exclusion zone 310 for a period between 0.1 second and 5 seconds. The one or more light sources can be a probe-type light, such as a laser diode with beam shaping optics. In another embodiment, the one or more light sources can be a LED with DMD. In another embodiment, the formable material 34 at the edge 340 of the exclusion zone 310 between the exclusion zone 310 and the active zone 320 can be cured while the formable material 34 in the active zone 320 can remain in a liquid state. Curing the formable material 34 at the boundary area 350 of the exclusion zone 310 can increase the viscosity of the formable material and decrease the speed at which the formable material moves. As such, the boundary area 350 of the exclusion zone 310 can act as a barrier and substantially prevent the formable material which is still in a liquid state from spreading into the exclusion zone 310.

In one embodiment, the one or more light sources can rotate about a central axis 330 of the substrate 12 to cure the formable material 34 at the edge of the exclusion zone 310 between the exclusion zone 310 and the active zone 320 and form a smooth edge circular boundary area 350. In another embodiment, the substrate 12 can rotate about a central axis 330 as the formable material at the edge of the exclusion zone 310 between the exclusion zone 310 and the active zone 320 is cured to form a circular boundary area 350. In one embodiment, the angular velocity of the one or more light sources relative to the substrate can be between 3 revolutions/second and 100 revolutions/second. In one embodiment, the angular velocity of the one or more light sources relative to the substrate can be between 5 revolutions/second and 15 revolutions/second. In one embodiment, the boundary area 350 can be circular. In another embodiment, the boundary area 350 can be elliptical. In one embodiment, the boundary area 350 can be continuous. In one embodiment, the exclusion zone 310 can have a diameter between 292 mm and 298 mm for a 300 mm substrate.

The method can continue at operation 250 by curing the formable material 34 in both the active zone 320 and the exclusion zone 310 to form a layer over the substrate 12. The formable material 34 can include a monomer or oligomer mixture that can be cured using ultraviolet light, heat, or the like. In one embodiment, curing is performed while the superstrate 18 is contacting the formable material 34. Following the curing, the superstrate 18 can be separated from the newly formed layer formed on the substrate 12. The layer 210 can protect the body 220 of the superstrate 18 such that the superstrate 18 can be used in subsequent planarization operations.

In one embodiment a method of manufacturing an article can include dispensing a formable material 34 over a substrate 12. The substrate 12 can include a non-uniform surface topography and the substrate 12 can be divided into an active zone 320 and an exclusion zone 310. The method of manufacturing an article can also include contacting the formable material 34 with a superstrate 18, curing the formable material 34 at the edge 340 of the exclusion zone 310 to form a circular boundary area 350 of the active zone 320, and curing the formable material 34 in the active zone 320 to form a layer over the substrate 12, where curing is performed while the superstrate 18 is contacting the formable material 34, separating the superstrate 18 and the planar layer on the substrate 12, processing the substrate 12 on which the planar layer has been formed, and manufacturing the article from the processed substrate 12.

Figure 5A:
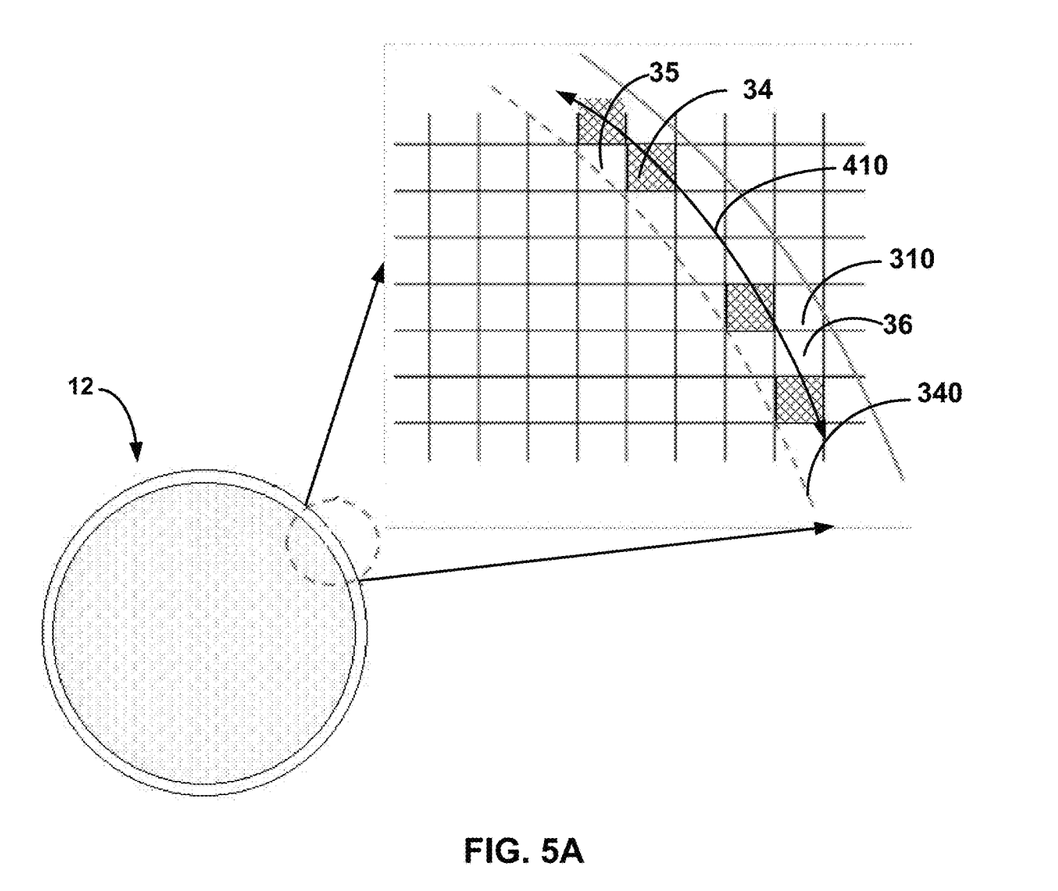
FIG. 5A includes a closer illustration of a portion of substrate, according to one embodiment.
Figure 5B:
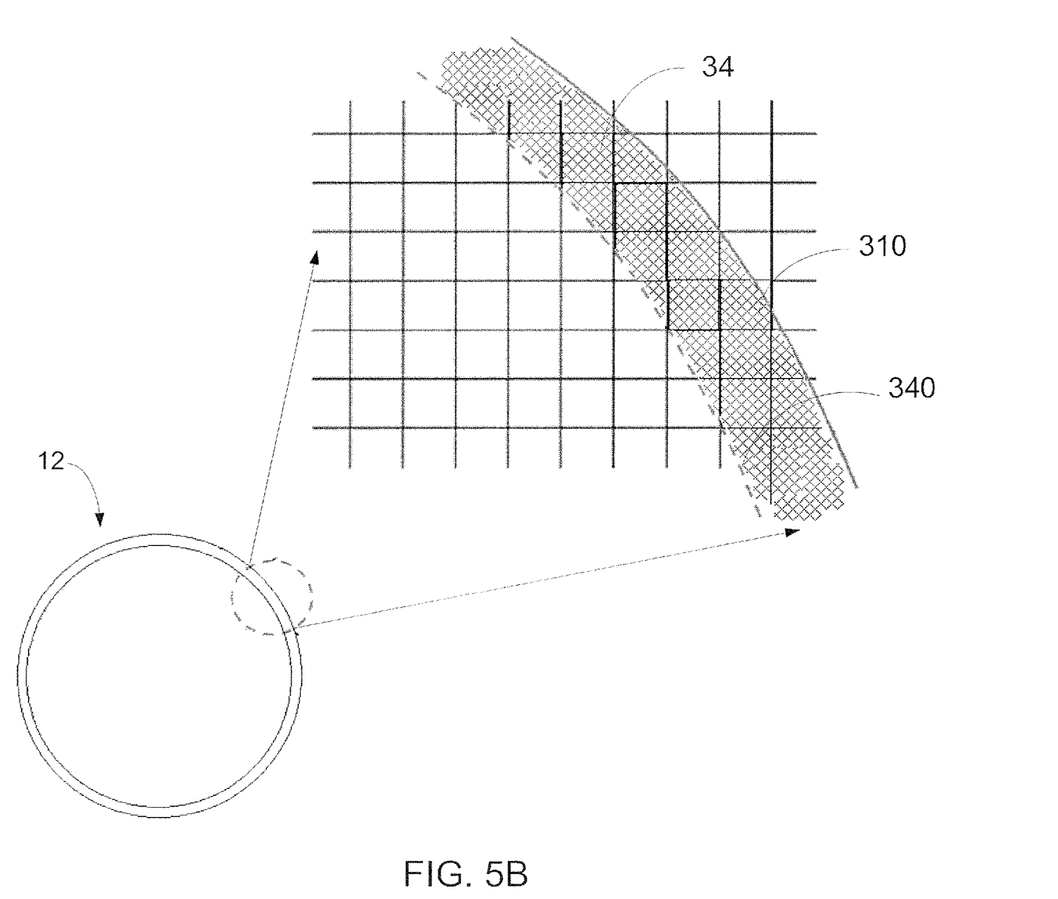
FIG. 5B includes a closer illustration of a portion of substrate, according to one embodiment.

FIG. 5A includes a closer illustration of a portion of substrate 12, according to one embodiment. In FIG. 5A, the formable material can be deposited within the active zone 320. After the contact between the superstrate and formable material, the formable material can begin to spread to the boundary edge 340. Potential pixels are shown as the grid in FIG. 5A. As illustrated in FIG. 5A, only a few pixels are appropriately located. Pixel 35 is located both within the active zone 320 and in the exclusion zone 310. Pixel 36 is farther away from the boundary of the active zone 320 and located completely within the exclusion zone 310. To form a smooth boundary of the active zone 320, pixels within the exclusion zone 310 can be activated while the substrate 12 and DMD moves relative in a theta motion. In one embodiment, a UV LED source can be used in combination with a DMD to activate the formable material moving from the active zone 320 towards the exclusion zone 310 as the substrate 12 moves in the theta motion. In one embodiment, the theta motion is about the central axis 330 of the substrate 12. As movement in the theta motion occurs, the pixels in the exclusion zone 310 are activated such that as the formable material 34 within the active zone moves toward the exclusion zone 310, a boundary area 350 can be formed, as seen in FIG. 5B. The boundary edge 340 is the border between the exclusion zone 310 and the active zone 320. Accordingly, by curing the formable material 34 at the boundary area 350 of the exclusion zone 310, the boundary area 350 prevents both non-fill defects and extrusion defects that otherwise become a problem in other systems.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of deposition, comprising:
    dispensing a formable material over a substrate, wherein the surface area of the substrate is divided into an active zone and an exclusion zone, and wherein the exclusion zone of the substrate circumferentially surrounds the active zone of the substrate;
    contacting the formable material over the substrate with a superstrate;
    curing the formable material to form a circular boundary area of the exclusion zone, wherein the circular boundary area of the exclusion zone faces the active zone, wherein curing the formable material to form the circular boundary area of the exclusion zone is provided by rotating one or more light sources relative the substrate around a central axis of the substrate, wherein the entire exclusion zone is cured by irradiating light from the one or more light sources while rotating along the exclusion zone relative the central axis of the substrate; and
    curing the formable material in the active zone to form a layer over the substrate, wherein curing is performed while the superstrate is contacting the formable material.

2. The method of claim 1, further comprising positioning the one or more light sources over the exclusion zone.

3. The method of claim 2, wherein curing the formable material to form the circular boundary area of the exclusion zone is provided by rotating the substrate around a central axis of the substrate.

4. The method of claim 2, wherein positioning the one or more light sources above the exclusion zone is for between 0.1 second and 20 seconds.

5. The method of claim 1, wherein the one or more light sources are rotated at a rate of between 3 revolutions/second and 100 revolutions/second.

6. The method of claim 1, further comprising determining an edge of the exclusion zone prior to dispensing formable material over the substrate.

7. The method of claim 1, wherein the exclusion zone is between 0.5% and 20% the surface area of the substrate.

8. The method of claim 1, wherein the exclusion zone surrounds and is exterior to the active zone.

9. The method of claim 1, wherein the one or more light sources are UV radiation.

10. The method of claim 1, wherein curing the formable material in the active zone is done by using a light source different from the one or more light sources shining above the exclusion zone.

11. The method of claim 1, wherein the cured material at the edge of the exclusion zone has a viscosity at least two orders of magnitude greater than a viscosity of the formable material in the active zone after rotating the one or more light sources over the exclusion zone.

12. The method of claim 1, wherein the one or more light sources comprises a laser diode.

13. The method of claim 12, wherein the laser diode uses a digital micromirror device (DMD) to expose the formable material.

14. The method of claim 1, wherein the one or more light sources comprises a UV light emitting diode (LED) and wherein the UV LED uses a digital micromirror device (DMD) to expose the formable material.

15. A method of manufacturing an article, comprising:
    dispensing a formable material over a substrate, wherein the surface area of the substrate is divided into an active zone and an exclusion zone, and wherein the exclusion zone of the substrate circumferentially surrounds the active zone of the substrate;
    contacting the formable material over the substrate with a superstrate;
    curing the formable material to form a circular boundary area of the exclusion zone, wherein the circular boundary area of the exclusion zone faces the active zone, wherein curing the formable material to form the circular boundary area of the exclusion zone is provided by rotating one or more light sources relative the substrate around a central axis of the substrate, wherein the entire exclusion zone is cured by irradiating light from the one or more light sources while rotating along the exclusion zone relative the central axis of the substrate;
    curing the formable material in the active zone to form a planar layer over the substrate, wherein curing is performed while the superstrate is contacting the formable material;
    separating the superstrate and the planar layer on the substrate;
    processing the substrate on which the planar layer has been formed; and
    manufacturing the article from the processed substrate.

* * * * *